United States Patent
Palusa et al.

(10) Patent No.: US 11,240,075 B2
(45) Date of Patent: Feb. 1, 2022

(54) SERDES RECEIVER WITH OPTIMIZED CDR PULSE SHAPING

(71) Applicant: Taiwan Semiconductor Manufacturing Company, Ltd., Hsinchu (TW)

(72) Inventors: Chaitanya Palusa, San Jose, CA (US); Rob Abbott, Ontario (CA); Rolando Ramirez, Hsinchu (TW); Wei-Li Chen, Hsinchu (TW); Dirk Pfaff, Ontario (CA); Cheng-Hsiang Hsieh, Taipei (TW); Fan-ming Kuo, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/157,114

(22) Filed: Jan. 25, 2021

(65) Prior Publication Data
US 2021/0218605 A1 Jul. 15, 2021

Related U.S. Application Data

(63) Continuation of application No. 16/741,188, filed on Jan. 13, 2020, now Pat. No. 10,904,044.
(Continued)

(51) Int. Cl.
*H04L 25/03* (2006.01)
*H04L 27/01* (2006.01)
(Continued)

(52) U.S. Cl.
CPC ....... *H04L 25/03878* (2013.01); *H03K 5/135* (2013.01); *H04L 25/028* (2013.01); *H04L 25/03038* (2013.01); *H04L 25/03057* (2013.01); *H04L 27/01* (2013.01); *H03K 2005/00052* (2013.01); *H03K 2005/00065* (2013.01)

(58) Field of Classification Search
CPC ............. H04L 25/03878; H04L 25/028; H04L 25/03028; H04L 27/01; H03K 5/135
See application file for complete search history.

(56) References Cited

U.S. PATENT DOCUMENTS 6,226,323 B1 * 5/2001 Tan .......................... H04B 1/68
375/233
6,775,334 B1 * 8/2004 Liu .......................... H04N 5/21
375/341
(Continued)

FOREIGN PATENT DOCUMENTS

KR 10-2017-0117133 A 10/2017
WO 2016/130360 A1 8/2016

*Primary Examiner* — Jaison Joseph
(74) *Attorney, Agent, or Firm* — Merchant & Gould P.C.

(57) ABSTRACT

An optimized pulse shaping clock data recovery system is provided that includes a slicer configured to receive a signal and provide an initial set of tentative decisions to a decision feedforward equalizer, where the decision feedforward equalizer provides a fully equalized output signal. The slicer may be incorporated as part of decision feedback equalizer to provide better quality tentative decisions. The clock data recovery system also receives the first output signal that is partially equalized in such a way as to optimally shape it for a clock to sample it at an ideal location by providing an adjustment signal to the analog to digital controller.

20 Claims, 16 Drawing Sheets

Related U.S. Application Data

(60) Provisional application No. 62/799,316, filed on Jan. 31, 2019.

(51) Int. Cl.
  *H03K 5/135* (2006.01)
  *H04L 25/02* (2006.01)
  *H03K 5/00* (2006.01)

(56) References Cited

U.S. PATENT DOCUMENTS

| | | | |
|---|---|---|---|
| 8,098,725 B2 | 1/2012 | Liu et al. | |
| 8,615,062 B2 * | 12/2013 | Chmelar | H04L 25/03057 375/350 |
| 9,077,574 B1 * | 7/2015 | Healey | H04L 25/03057 |
| 9,584,345 B1 * | 2/2017 | Baecher | H04Q 9/06 |
| 2013/0202065 A1 | 8/2013 | Chmelar | |
| 2013/0243066 A1 * | 9/2013 | Palusa | H04L 25/03057 375/232 |
| 2015/0195108 A1 * | 7/2015 | Prokop | H04L 25/03057 375/233 |

* cited by examiner

Single stage Multi-tap DFFE with Precursor and Postcursor Taps

SERDES RECEIVER WITH OPTIMIZED CDR PULSE SHAPING

CROSS-REFERENCE TO RELATED APPLICATION(S)

This application is a continuation of U.S. patent application Ser. No. 16/741,188, filed on Jan. 13, 2020, now U.S. Pat. No. 10,904,044, which claims the benefit of U.S. Provisional Application No. 62/799,316 entitled "MULTI-TAP DECISION FEED-FORWARD EQUALIZER WITH PRECURSOR AND POSTCURSOR TAPS," filed on Jan. 31, 2019, the entire disclosures of which are hereby incorporated by reference.

BACKGROUND

Feedforward Equalizers (FFE) and Decision Feedback Equalizers (DFE) are among the most common equalizers used in state of the art SerDes receivers to compensate for Inter-Symbol Interference (ISI). Both equalizers have their respective advantages and disadvantages. FFE has the ability to correct both precursor and postcursor ISI but it tends to amplify noise and crosstalk as well. DFE corrects postcursor ISI and does not boost noise in the process but it lacks the ability to correct precursor ISI. DFE is a powerful equalizer for postcursor ISI correction but it suffers from error propagation that FFE does not. For DSP based SerDes, a parallel data path realization of both these equalizers is required and FFE lends itself well for such implementations whereas DFE does not as its complexity increases exponentially with number for taps. Even though DFE is preferred over FFE due to its inherent ability to not amplify noise, it is not practical to implement it to correct postcursor ISI beyond the first few taps. As such, most DSP SerDes receivers employ multiple taps of FFE for both precursor and postcursor ISI correction followed by just one or two taps of DFE for postcursor correction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
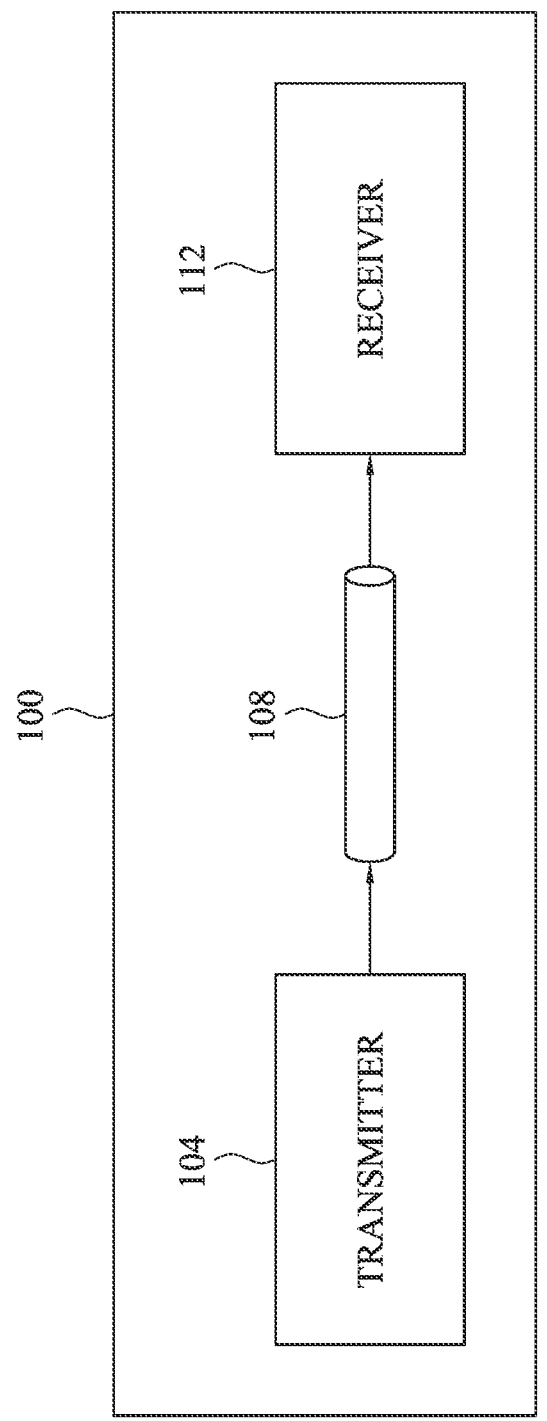
FIG. 1 depicts a block diagram of a communication system in accordance with examples of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples described herein are directed to a digital signal processing (DSP) Serializer/Deserializer (SerDes) receiver architecture that includes a Decision Feedforward Equalizer (DFFE) and equalization and clock data recovery (CDR) modules integrated with joint auto adaptation in such a way that the signal is optimally shaped for improved CDR and SerDes performance. Serdes is a device commonly used in high speed communications to compensate for limited inputs and outputs. A SerDes device converts data between parallel interfaces and serial interfaces, using one or more differential lines to transmit data from point A to point B.

FIG. 1 depicts a block diagram of a SerDes communication system 100 in accordance with examples of the present disclosure. More specifically, the SerDes system 100 includes a transmitter 104 communicatively coupled to a receiver 112 via a communication channel 108. The transmitter 104 is configured to send one or more signals through the communication channel 108 to the receiver 112. The transmitter 104 may include one or more finite impulse response filters for conditioning data before transmission to the communication channel 108. The communication channel 108 may be a physical transmission medium, such as a backplane, drive head in a magnetic recording system, copper cables, optical fibers, one or more coaxial cables, and/or wire, or the communication channel 108 may include a one or more radio frequency (RF) channels. Although described herein as being utilized in a SerDes communication system 100, examples of the present disclosure are not so limited, and some examples might be employed in alternative communications systems utilizing a transmitter and a receiver communicating over a communication channel. Moreover, it is understood that each "bit" of a signal has a corresponding logic value and that various signals described herein may utilize multi-bit data symbols based on various data encoding schemes, such as pulse amplitude modulation (e.g., PAM-4).

The effect of Inter-Symbol Interference (ISI) generally increases as the transmission speed in the channel 108 increases. ISI is a form of distortion of a signal in which one symbol interferes with subsequent symbols. This is an unwanted phenomenon as the previous symbols have a similar effect as noise and therefore make the communication less reliable. That is, the spreading of a pulse representing one or more portions of a communication beyond its allotted time interval causes it to interfere with neighboring pulses. ISI is usually caused by multipath propagation or the inherent linear or non-linear frequency response of a communication channel causing successive symbols to "blur" together. Therefore, the presence of ISI in a communication system may introduce errors that propagate to receiver output. Accordingly, a design of transmitting and receiving filters generally minimizes the effects of ISI, and thereby delivers digital data to its destination with the smallest error rate possible.

Traditional SerDes architectures are generally limited by the coupling issue between CDR and equalization adaptation. If CDR and equalization are both adapted from a final equalized node, then the pulse response is ideally flat due to equalization; however such a flat pulse response makes it difficult for baud-rate CDRs that are typically used in such architectures to find a stable locking point since multiple points on the pulse response satisfy the convergence criterion. To mitigate this issue, CDR and equalization are adapted using different nodes, where the CDR uses a partially equalized node. This may potentially decouple CDR and equalization to avoid the fully equalized joint adaptation issue but the pulse response at the partially equalized CDR node may not be symmetric which may lead to a sub-optimal CDR locking point. Even if the CDR convergence point is optimal relative to the partially equalized CDR node, the CDR convergence point may not be optimal relative to the fully equalized final node. Thus, the traditional SerDes architecture typically requires CDR locking point adjustment mechanisms to achieve better margins which adds to the complexity of the overall architecture. The CDR locking point and the BER margins tend to be sensitive to the transmitter settings since they play a big role in determining the shape of the pulse response and as such link tuning becomes a much harder exercise. Furthermore, since DFE is limited to postcursor ISI alone, equalization tends to be dominated by FFE which makes it more sensitive to noise and crosstalk. Accordingly, limitations in traditional SerDes architecture include but are not limited to the following: the coupling between the CDR and equalization which leads to unsafe CDR convergence points; a pulse response that may not be symmetric at the CDR node which leads to a sub-optimal CDR locking point; traditional SerDes architecture typically require CDR locking point adjustments for better margins; link margins of traditional SerDes architectures are sensitive to transmitter settings and link tuning tends to be a non-trivial exercise.

Figure 2:
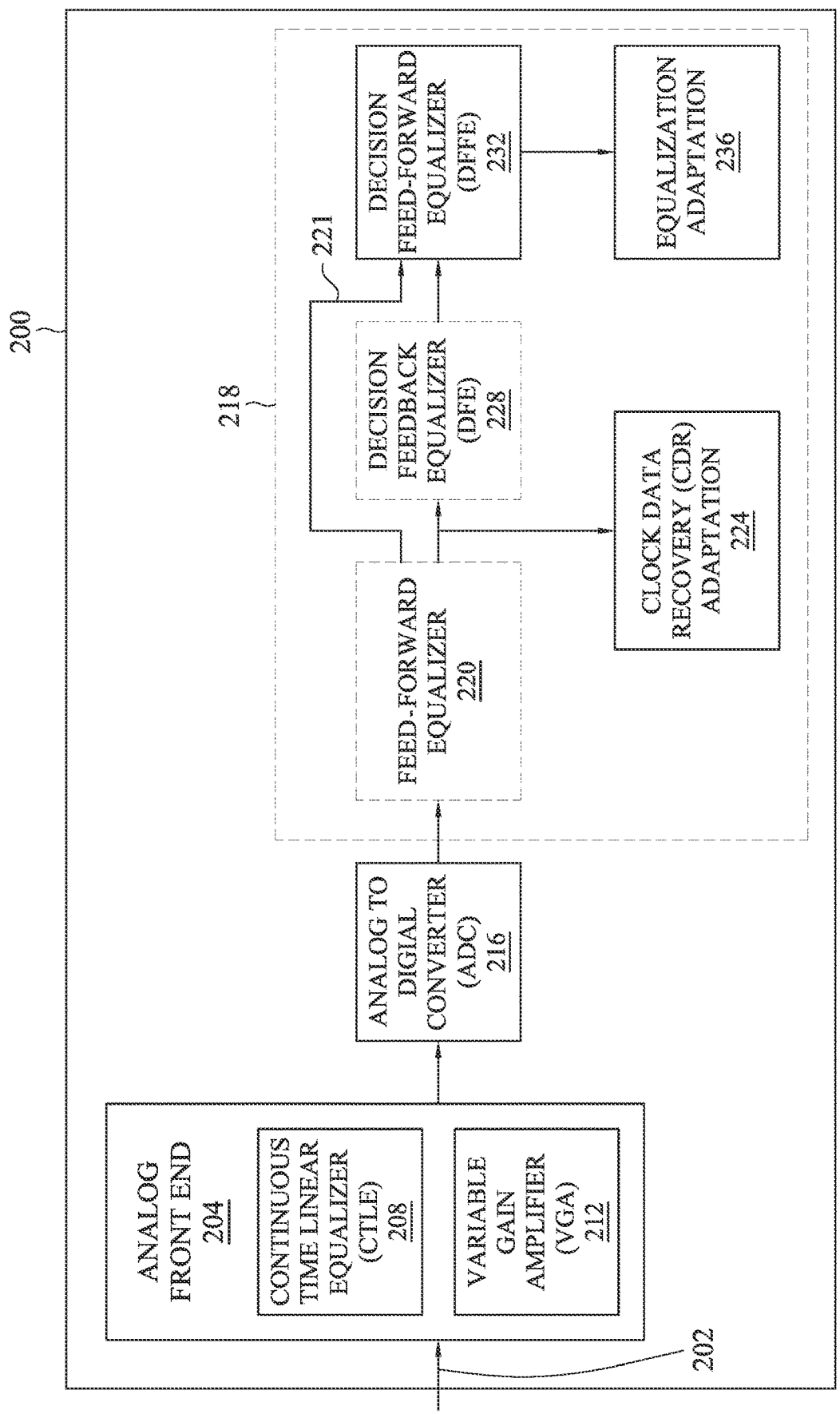
FIG. 2 depicts a block diagram of a SerDes receiver architecture in accordance with examples of the present disclosure.

FIG. 2 depicts an example SerDes receiver architecture 200 that includes an equalization data path for achieving both precursor and postcursor ISI correction through a combination of a FeedForward Equalizer (FFE), Decision Feedback Equalizer (DFE), and a precursor tap enabled multi-tap Decision FeedForward Equalizer (DFFE). The SerDes receiver architecture 200 may be implemented in the receiver 112, and as illustrated in FIG. 2, may include an Analog Front End (AFE) 204 that includes one or more of a Continuous Time Linear Equalizer (CTLE) 208 and a Variable Gain Amplifier (VGA) 212. Since a serial-data channel tends to attenuate higher frequencies of a signal more than lower frequencies of the signal, the CTLE 208 is included to boost high frequencies of a received signal 202 received at the SerDes receiver architecture 200 in order to bring a majority of the frequency components of the received signal 202 to a similar or same amplitude. However, by boosting signal frequencies, jitter and noise are also boosted. The VGA 212 may be included to variably boost signal amplitudes of the signal across the majority of frequencies. Accordingly, the AFE 204 generally minimizes ISI introduced by the combined characteristics of the transmitter and channel, such as ISI due to the channel's impulse response, thereby reducing ISI at the receiver.

The AFE 204 may provide the equalized signal to the analog to digital converter (ADC) 216 to convert the received and equalized signal into a digital signal for subsequent digital signal processing at a digital signal processor (DSP) 218. The DSP may include, but is not limited to a FFE 220, a clock data recovery (CDR) adaptation 224, a DFE 228, a DFFE 232, and an equalization adaptation 236. More specifically, the CDR adaptation 224 may tap an intermediate node in the equalization data path between the DFE 220 and the DFE 228 for reduced latency which leads to improved jitter tracking performance. The joint adaptation (e.g., CDR adaption 224 and Equalization adaptation 236) that is implemented as part of the SerDes receiver architecture 200 resolves potential negative interaction mechanisms between CDR adaptation 224 and equalization adaptation 236. That is, the unique combination of equalization provided by the SerDes receiver architecture 200 together with the CDR adaption 224 realizes a symmetric pulse response at the CDR node that's optimal for Mueller-Muller baud-rate CDR. Mueller-Muller CDR, sometimes referred to as MM CDR, is a common and popular type of baud rate CDR. As the MM-CDR is typically sensitive to the shape of the pulse response, the proposed SerDes receiver architecture 200 addresses this limitation by "pulse shaping" the signal to be symmetric irrespective of the actual channel pulse response. The MM-CDR also suffers from issues related to finding a stable locking point when locking to a fully equalized node since every point on the pulse response can be a potential locking point. However, the proposed SerDes receiver architecture 200 addresses this issue by introducing residual ISI symmetrically with first tap postcursor ISI equal to first tap precursor ISI. This ensures a stable CDR convergence point with improved timing margins. The residual ISI is fully compensated by the final equalization stages and therefore does not impact the final bit-error-rate (BER) of the fully equalized signal that is used for making decisions. Furthermore, the SerDes receiver architecture 200 has improved performance in the presence of noise and crosstalk when compared to a traditional FFE dominant architecture due to the additional use of the DFFE 232 for both precursor and postcursor ISI correction. The SerDes receiver architecture 200, as presented herein, achieves robust performance with BER improvement over traditional architectures across a wider range of transmitter settings as it is largely insensitive to the channel pulse response by virtue of its CDR pulse shaping capability.

Figure 5:
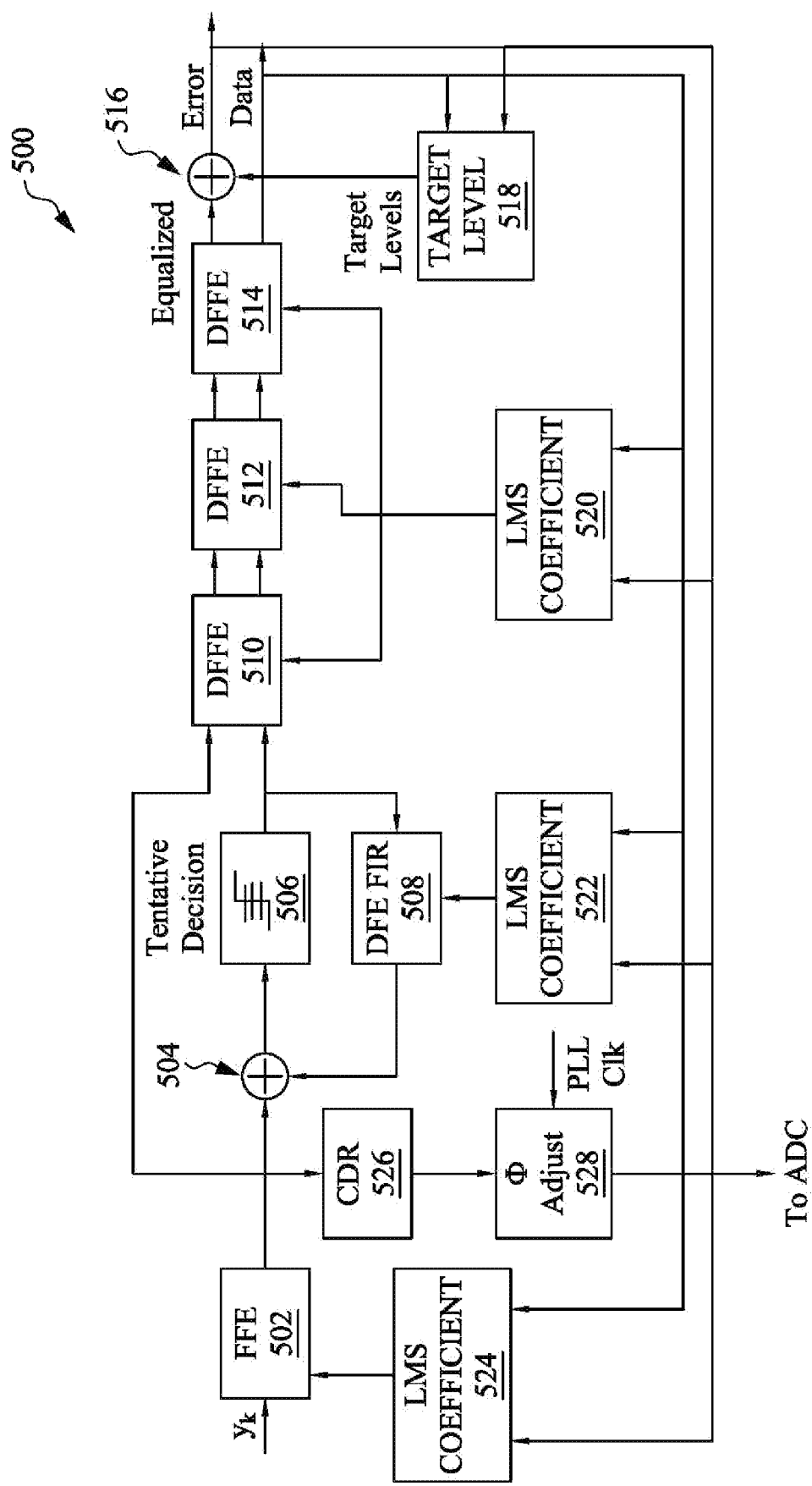
FIG. 5 depicts a block diagram of a SerDes receiver architecture in accordance with examples of the present disclosure.

Unlike traditional SerDes architectures, in the SerDes receiver architecture 200, the DFE 228 may not be part of the main signal data path. That is, in the equalization data path 221 as shown in FIG. 2, the signal equalized by the DFFE 232 is actually the output of the FFE 220. The DFE 228 merely provides a first set of tentative decisions corresponding to the FFE 220 output for the DFFE 232 to process. Thus, the DFE 228 may be omitted in some implementations. The DFE 228 may be used to start with a good BER at the input of the DFFE 232. If the DFE 228 is bypassed, additional DFFE 228 stages, for example as depicted in FIG. 5, may be used to achieve a desired BER. In principle, the DFE 228 can be bypassed and its usage can be determined by implementation cost tradeoffs.

Similar to the DFE 228, the FFE 220 also may be omitted in some embodiments. The FFE 220 provides additional pre-equalization such that a signal starts off with a better SNR which provides a better BER of tentative decisions requiring fewer DFFE stages overall. The FFE 220 may boost noise which can be addressed by removing the FFE 220 completely; however, additional DFFE stage(s) may be used to achieve a desired BER when the FFE 220 is not included in the architecture 200.

In accordance with examples of the present disclosure, the SerDes receiver architecture 200 provided in FIG. 2 taps, or utilizes, the FFE 228 node for CDR which has the benefit of having sufficient equalization to reduce CDR noise and lower latency to improve jitter tracking. Accordingly, the CDR adaptation 224 is decoupled from the Equalization adaptation 236 in principle since they are tapped from different nodes; that is, the CDR adaptation 224 utilizes the FFE 220 while the Equalization Adaptation 236 utilizes the DFFE 232. Accordingly, the SerDes receiver architecture 200 has the ability to adapt precursor and postcursor ISI correction at both the intermediate CDR FFE node, for example the FFE node 220, and the final equalized DFFE node, for example, the DFFE node 232. As will be explained later, this implementation provides the flexibility to shape a symmetric pulse response at the CDR node 224, irrespective of the transmitter settings, utilizing residual ISI of both precursor and postcursor taps 220, 232 fully compensated by follow-on DFFE stages. Since the SerDes receiver architecture 200 utilizes a multi-tap DFFE 232 topology with precursor taps, precursor ISI along with postcursor ISI at the CDR node 224 may be utilized so that the pulse response is symmetric and optimized for MM-CDR.

The DFFE 232 removes residual ISI present at the CDR node 224 since the DFFE 232 has the ability to correct both precursor and postcursor ISI. Furthermore, since significant equalization of the signal occurs after the FFE 228 with tentative decisions based on the DFFE 232, the SerDes receiver architecture 200 is not FFE dominant and performs better in the presence of noise and crosstalk than a traditional FFE dominant architecture. Robust performance is observed with orders of BER improvement over traditional architecture due to the factors listed above. In summary, the SerDes receiver architecture 200 may optimize pulse shaping for MM-CDR; reduce latency and improve jitter tracking as a result due to CDR tapping from an intermediate node in the equalization data path; reduce and/or eliminate coupling issues between CDR adaptation and equalization adaptation; provide a wider operating range of SerDes settings; require no special CDR locking point adjustment, improve crosstalk performance over FFE dominant SerDes architectures; and provide a robust performance while improving BER over traditional SerDes architectures.

The CDR pulse shaping features achieved via the SerDes receiver architecture 200 discussed above are further illustrated with reference to FIGS. 3-4C. In accordance with the present disclosure, references to MM CDR and baud date CDR are meant as references to the phase error detector (PED) that is used in a CDR loop 224 and not to be confused with the entire signal processing loop as a whole. For example, a PED may compare a phase between input data and a recovered clock and provide information to adjust a sampling clock's phase. While the present disclosure primarily focusses on MM-CDR, details discussed herein may be generalized to other baud-rate CDRs since they share similar convergence properties.

Figure 3:
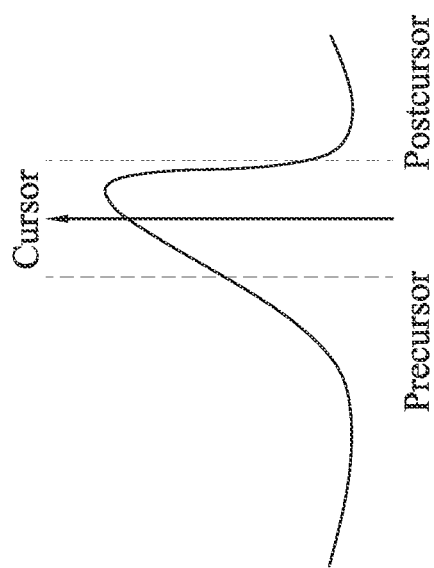
FIG. 3 depicts an example signal illustrating locked, early, and late clock conditions in accordance with examples of the present disclosure.
Figure 4A:
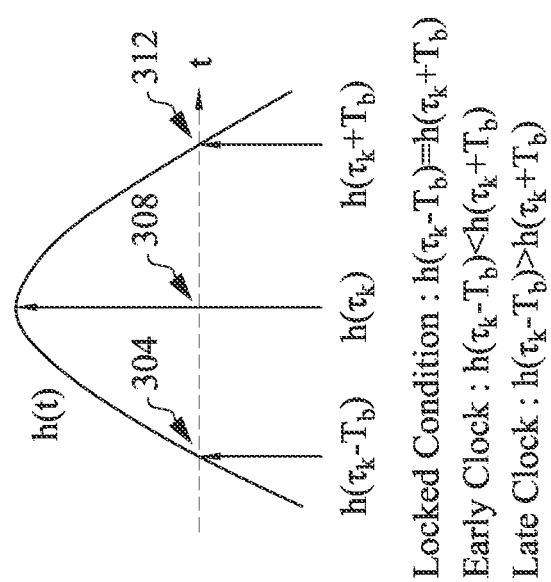
FIGS. 4A-4C depict example waveforms identifying precursor, cursor, and postcursor locations in accordance with examples of the present disclosure.

MM CDR timing recovery may be explained using a pulse response as shown in FIG. 3. The first precursor 304, the main cursor 308, and the first postcursor 312 are represented in FIG. 3 by $h(\tau_k-T_b)$, $h(\tau_k)$ and $h(\tau_k+T_b)$ respectively, which may also be referred to utilizing a more simple notation $h_{-1}$, $h_0$ and $h_1$ respectively. The clock phase conditions may be written as $h_{-1}=h_1$ (locked condition); $h_{-1}<h_1$ (early condition); and $h_{-1}>h_1$ (late condition). An optimal scenario for MM CDR is to lock at the peak of the pulse response, $h_0$, and because the locking condition is given by $h_{-1}=h_1$, an optimal pulse response at the CDR node is a symmetric pulse response with an initial condition of $h_{-1}=h_1$. For a given asymmetrical pulse as shown in FIG. 4A having an initial $h_{-1}<h_1$ and FIG. 4B having an initial $h_{-1}>h_1$, the CDR locks later or earlier than the given peak of the response, respectively, to ensure residual $h_{-1}=h_1$ leading to a lower $h_0$ after CDR convergence which ultimately results in lower margins.

Figure 4B:
Figure 4C:
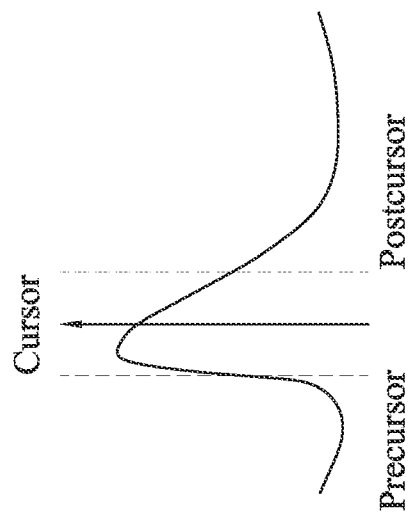

However, for an ideal square wave pulse response with $h_{-1}=h_1=0$ as shown in FIG. 4C, MM CDR has an unstable locking point as any point on the peak of the pulse response is a potential convergence point. This is due to the fact that even if CDR moves early or late, the CDR convergence criterion is met as long as the CDR is sampling the peak of the pulse response. MM CDR, in effect, can be considered to be a peak detector similar to other baud rate CDRs; however, since a square wave pulse response has multiple peaks, it is actually not an optimal pulse response for MM CDR even though jitter and noise may result in a wide open eye. Such a scenario may be encountered when a fully equalized node is sampled with MM CDR. Thus, an ideal node for MM CDR has partial equalization with residual $h_{-1}=h_1$.

FIG. 5 depicts a SerDes receiver architecture 500 illustrating further aspects of the SerDes receiver architecture 218 of FIG. 2 in accordance with examples of the present disclosure. The SerDes receiver architecture 500 may initially receive, from an ADC, such as the ADC 216, a digital signal $y_k$. The digital signal $y_k$ may be provided to an FFE 502, where the FFE 502 may be a finite impulse response (FIR) filter that can correct both precursor ISI and postcursor ISI. From the FFE 502, a precursor ISI and postcursor ISI corrected signal may proceed to a junction 504 where it may be combined with a compensated postcursor ISI signal provided from a tentative decision slicer 506 and DFE FIR 508 to generate a further compensation signal. The signal provided to and equalized by a DFFE, such as DFFE 510, may be the output of an FFE, such as FFE 502. The DFE FIR 508 provides a first set of tentative decisions from the tentative decision slicer 506 corresponding to the FFE 502 output for the DFFE 510 to process. The DFE FIR 508 may be used to provide an initial BER at the input of the DFFE 510. In some instances, the DFE 508 may be bypassed or otherwise not utilized; in such instances, additional DFFE 510 stages, such as DFFE 512, DFFE 514, may be implemented to achieve a desired BER at the final output.

From the multistate multi-tap DFFEs 510-514, error may be determined at junction 516 based on target levels 518. While DFFEs 510-514 are illustrated in FIG. 5, more or fewer DFFEs may be utilized. As further depicted in FIG. 5, one or more least mean square LMS coefficients 520 may be derived from the error and data provided by the DFFE 514; the one or more LMS coefficients 520 may be provided back to each of the DFFE 510-514. Moreover, LMS coefficients 522 and/or 524 may be provided to the DFFE FIR 508 and FFE 502. A CDR adaption may occur at 528 and may be provided back to the ADC, such as ADC 216. Additional details of a DFFE are provided in FIGS. 9-10 in accordance with examples of the present disclosure.

Figure 6:
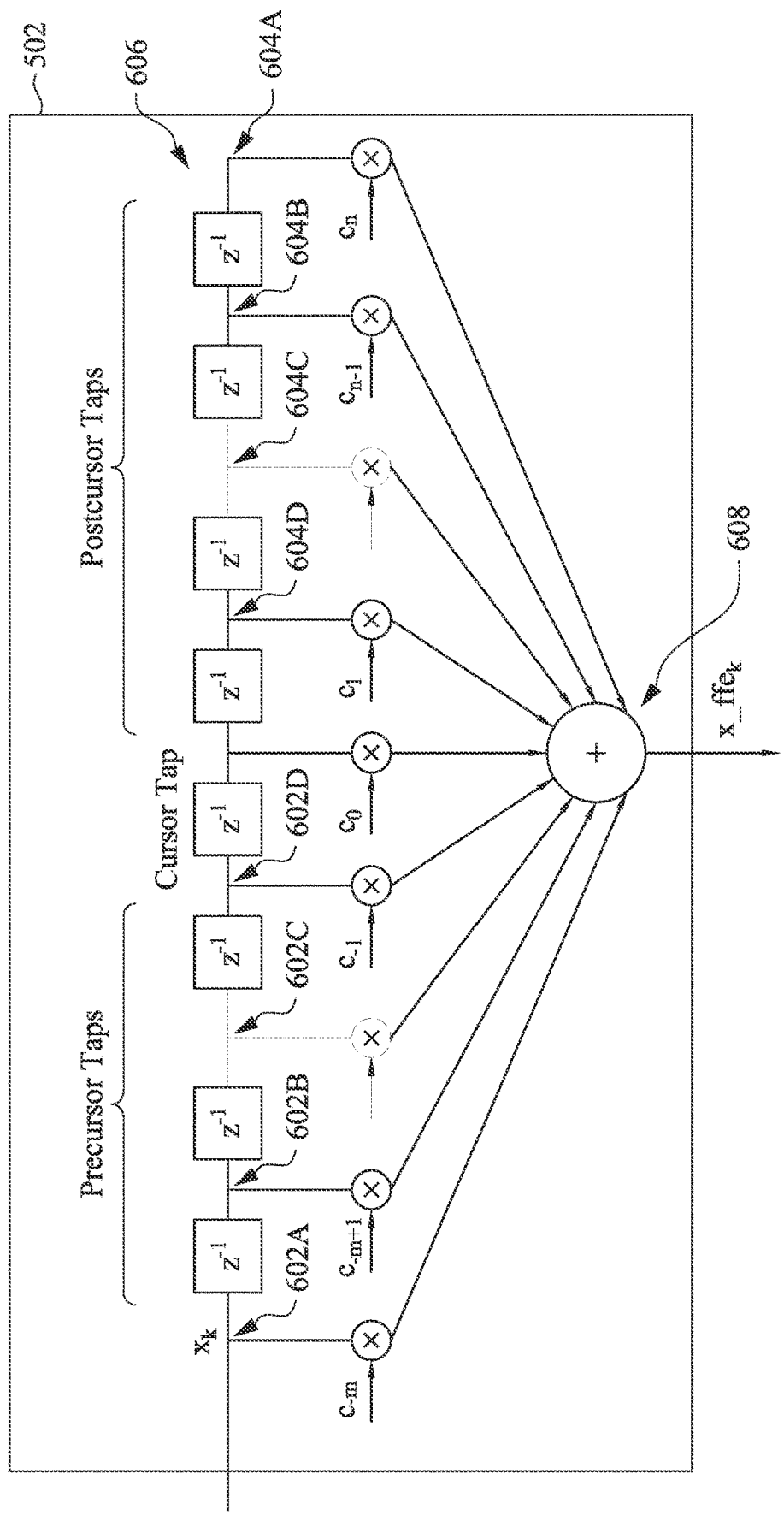
FIG. 6 depicts a block diagram of a Feedforward Equalizer (FFE) with m Precursor and n Postcursor taps in accordance with examples of the present disclosure.

FIG. 6 provides additional details of an example of the FFE 502 in accordance with examples of the present disclosure. More specifically, the FFE 502 may be a finite impulse response (FIR) filter that may correct both precursor ISI and postcursor ISI. As depicted in FIG. 6, a block diagram depicts an FFE for one symbol with 'm' precursor taps (602A-602D) and 'n' postcursor taps (604A-604D), as well as a plurality of unit delays 606. The unit delays 606, for example $z^{-1}$, required for FFE implementation may be implemented in a DSP SerDes architecture such as the SerDes receiver architecture 200 within the digital domain. While the FFE can provide a high frequency boost to compensate for channel loss, correct both precursor ISI and postcursor ISI, and provide a parallel data path implementation, the FFE may amplify crosstalk and noise and may be cost prohibitive to implement when multiple taps may be required. However, the FFE 502 may provide an initial signal to the CDR and follow-on equalization stages. An initial signal, $x_k$, may be input, where one or more precursor signal components derived from the precursor taps 602A-602D and delayed by $z^{-1}$ for example, and one or more postcursor signal components derived from the postcursor taps 604A-604D and delayed by $z^{-1}$ for example, may be provided to a summation component 608. The FFE 502 may output the signal x_ffek.

Figure 7B:
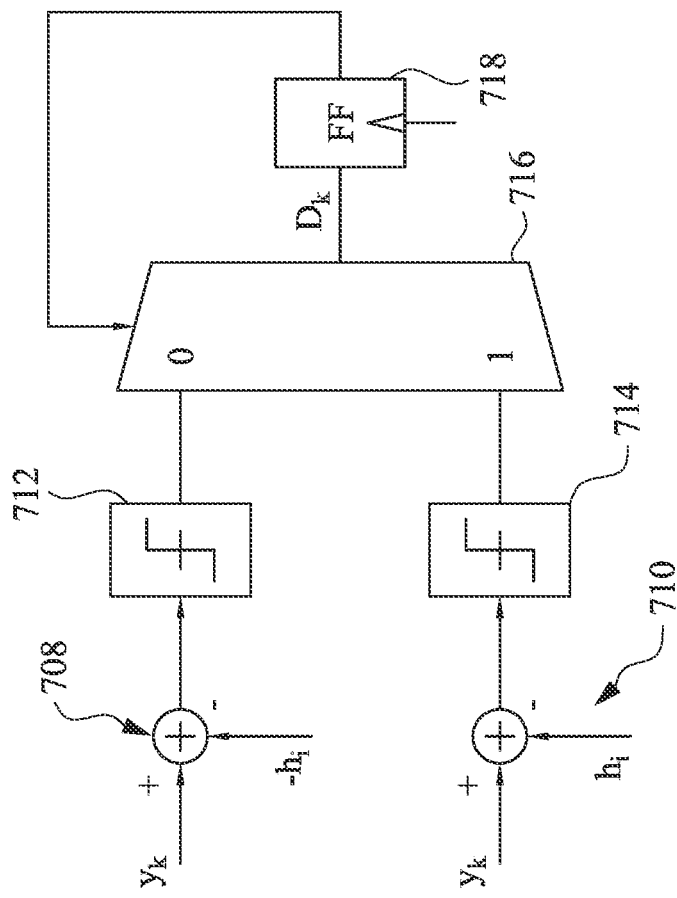
FIGS. 7A-7C depict block diagrams of a Decision Feedback Equalizer (DFE) in accordance with examples of the present disclosure.
Figure 7A:
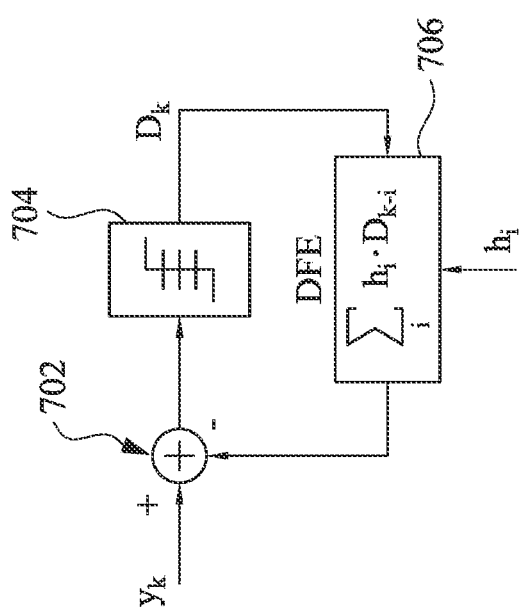
Figure 7C:
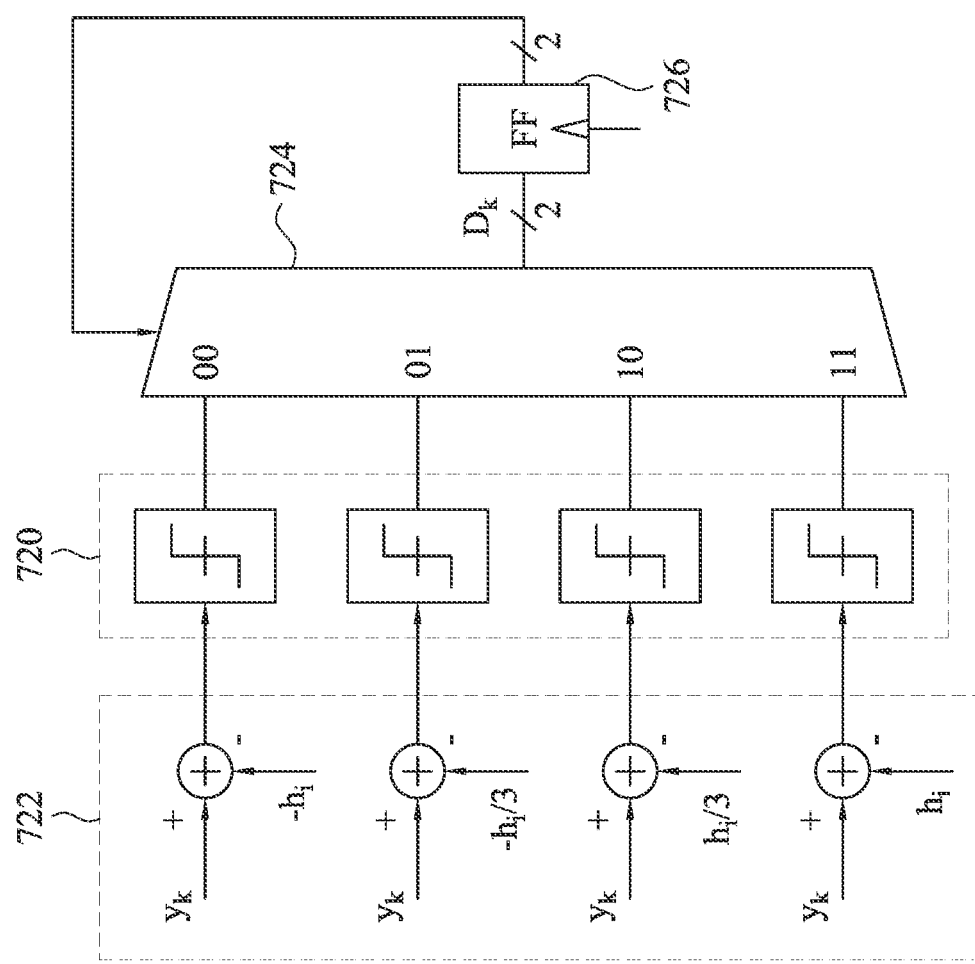

FIGS. 7A-7C depict additional details of DFE implementations, corresponding to the DFE 508, decision slicer 506 and junction 204 shown in FIG. 5, in accordance with examples of the present disclosure. More specifically, a DFE, such as DFE 508, is a filter that may use feedback of detected symbols to produce an estimate of an output, such as a channel output. Detected symbols are input to the DFE, such as DFE 508, such that the DFE produces an output which may be subtracted from the output of a linear equalizer if one is present. The DFE, such as DFE 508, may correct postcursor ISI, as depicted in FIG. 4B for example, by including a FIR filter in a feedback loop using actual decisions from a decision slicer. Since DFE uses past decisions in a feedback path, DFE can only correct postcursor ISI associated with those symbols. DFE does not have the ability to correct precursor ISI as that requires the knowledge of future samples.

FIG. 7A illustrates a block diagram of a DFE in a 'direct feedback' configuration. That is, a signal $y_k$, may be provided to a summation junction 702; the signal resulting from the summation junction 702 is provided to the decision slicer 704, where the decision slicer 704 makes a symbol decision. The decision slicer 704 quantizes the input such that the ISI may be directly subtracted from the incoming signal $y_k$ via the feedback FIR filter 706.

Some topologies of DFE pre-calculate decisions speculatively and choose one of the pre-calculated decisions based on past symbols in order to eliminate the feedback path at the decision slicer 704. For example, a block diagram of a 1-tap speculative DFE is illustrated in FIG. 7B for NRZ signaling and FIG. 7C for PAM4 signaling. The 1-tap speculative DFE illustrated in FIG. 7B includes summing junctions 708 and 710, decision slicers 712 and 714, a multiplexor 716 and a latch or flip flop 718. The number of slicers for 1-tap DFE may be doubled for PAM4 over NRZ along with the change of associated multiplexor to 4-to-1 from 2-to-1 as depicted in FIG. 7C. That is, the number of slicers 720 fed by inputs 722 may be doubled over the NRZ signaling of FIG. 7B, requiring a multiplexor 724 with additional inputs providing a selected signal to the flip flop 726.

In accordance with examples of the present disclosure, a configuration of iterative Decision Feedforward Equalizer using tentative decisions is presented herein that is less complex than multitap DFEs to implement and achieves both multi-tap precursor and postcursor ISI correction. Tentative decisions may be used such that multiple iterations improve the quality of the tentative decisions.

Figure 8:
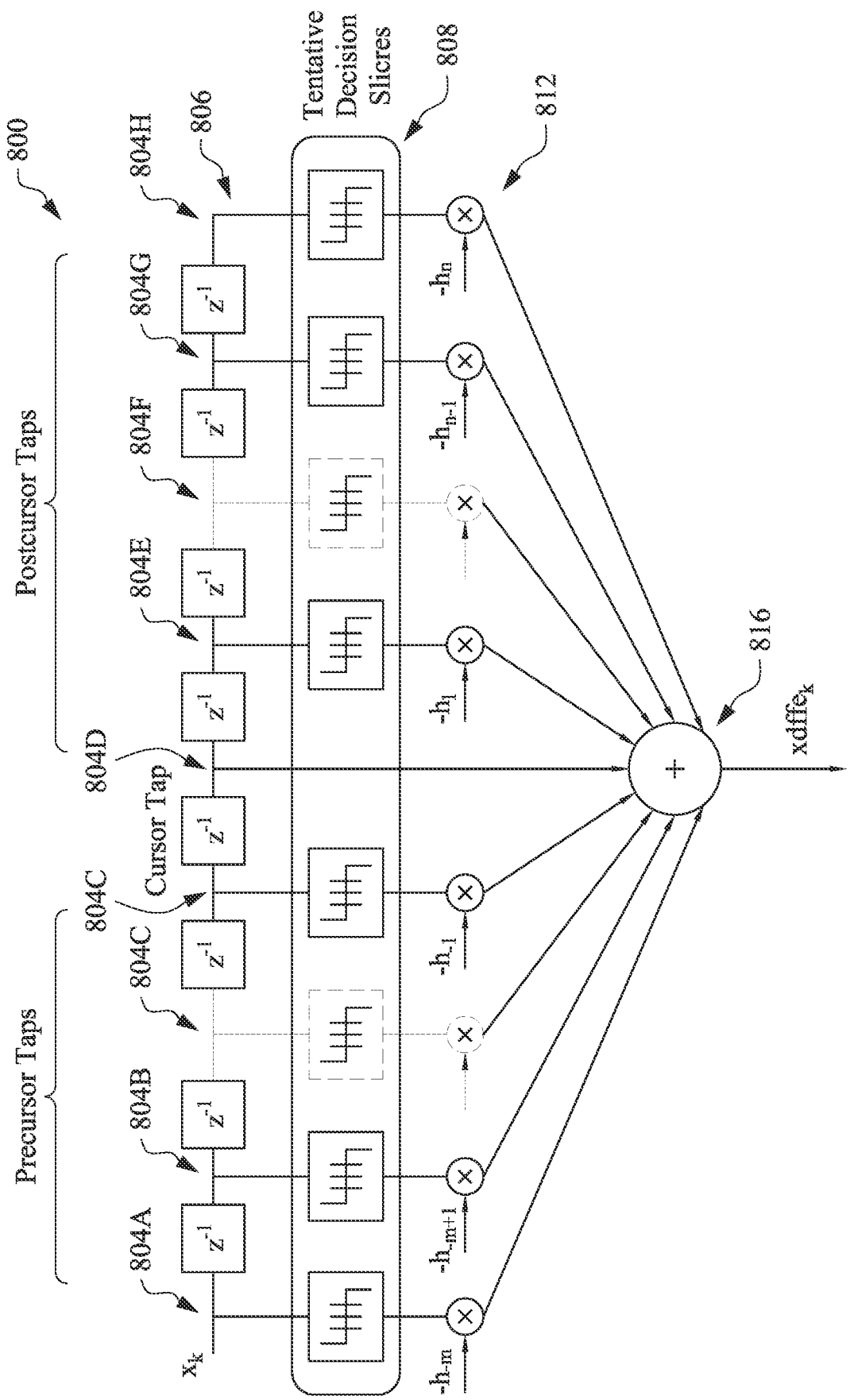
FIG. 8 depicts a block diagram of a single stage multi-tap Decision Feedforward Equalizer (DFFE) in accordance with examples of the present disclosure.

FIG. 8 illustrates further aspects of a DFFE, such as the DFFE 510 of FIG. 5, in accordance with some examples. More particularly, FIG. 8 depicts a basic iteration stage of a multi-tap DFFE configuration 800 with 'm' precursor and 'n' postcursor taps. The multi-tap DFFE configuration depicted in FIG. 8 does not suffer from noise or crosstalk enhancement as FFE does since DFFE uses decision outputs of slicers as inputs to the FIR unlike FFE which uses actual analog signal inputs. The digital outputs of the tentative decision slicers are multiplied with the tap coefficients to reduce an amount of noise. Further, since digital outputs are used as the multiplier inputs, the multipliers in effect get turned into adders which tend to be easier to implement. More specifically, a signal $x_k$ may be input to precursor taps 804A-C, the cursor tap 804D, and the post cursor taps 804E-H (collectively taps 804) and may be delayed at each tap 804 by an amount $z^{-1}$ as shown in delay elements 806. Each of the taps 804 are then fed to a tentative decision slicer 808. Each of the outputs from the tentative decision slicers 808 may be provided to multipliers 812, where each multiplier 812 multiplies the result of the tentative decision slicer 808 by a coefficient. For example, the tentative decision slicer 808 may quantize the sampled input from the filter taps 804A-804H, where the quantized value may be scaled by a filter tap coefficient provided at the multipliers 812. Each of the outputs from the multipliers 812 may be provided to an adder, or combiner 816, where each of the outputs are effectively subtracted from the cursor tap 804D, providing an output that is precursor and postcursor ISI compensated.

Figure 9:
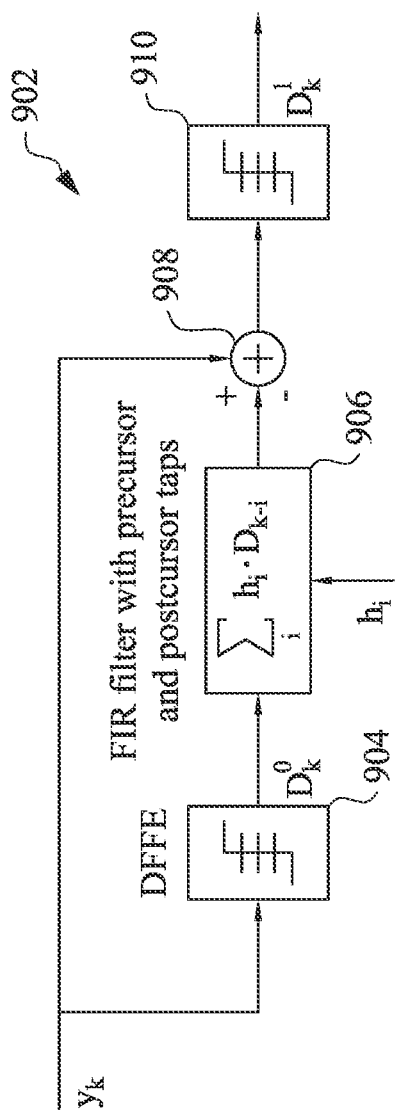
FIG. 9 depicts a conceptual block diagram of a DFFE in accordance with examples of the present disclosure.

The mathematical block diagram of single stage DFFE 902, corresponding to the example DFFE 510 of FIG. 5, is illustrated in FIG. 9. As previously mentioned, the decisions at the first slicer 904 output are only tentative which are then used in the FIR filter 906 to equalize the signal at the junction 908, which is then input to the next stage slicers, such as slicer 910. The bit-error-rate (BER) of the final stage decisions, such as 910, can be shown to be lower or better than the BER of the previous stage tentative decisions, such as 904 for example. This property of DFFE may be used to cascade multiple stages and lower the BER to the desired level with each successive iteration. The lower the starting BER, the fewer the required stages of DFFE. Furthermore, since decisions are tentative and used as inputs in a feed-forward path as opposed to the feedback path of DFE, DFFE does not suffer from error propagation. More importantly, the complexity of the DFFE scales linearly with the number of taps and thus it is feasible to implement multi-tap DFFE for both precursor and postcursor ISI in a DSP SerDes architecture. Accordingly, higher order floating taps may be implemented to handle non-ideal channel behavior such as reflections. Advantages of DFFE include ISI cancellation with no crosstalk or noise enhancement; an implementation complexity that scales linearly with the number of taps; a parallel data path DSP implementation; reduced or no error propagation as exhibited by DFE; reduced or no critical feedback path timing challenges as seen in DFE; and the multipliers of FFE may be replaced by adders in DFFE.

It can be the shown that the quality of the decisions at the output slicers, such as output slicer 910 for example, is better than the quality of the tentative decisions at the preceding stage slicers, for example tentative decisions from the decision slicer 904. The reason is that when the first stage slicers, such as slicers 904 for example, make the correct tentative decisions, the output stage slicers, such as slicer 910, also make the correct decisions with an increased margin. However, when the tentative decisions, from slicer 904 for example, are incorrect, the output stage slicers, such as slicer 910, doesn't always make incorrect decisions. That is, the final stage decisions may be correct even when the tentative decisions are in error since wrong tentative decisions can, in some instances, provide helpful ISI compensation even if it is technically incorrect. This is because the ISI is actually helpful when there are no transitions in the data pattern. For example, for a data pattern of $D_{k-1}=D_k$ the ISI from a $D_{k-1}$ symbol improves the signal levels for detecting a $D_k$ symbol. Further, when $D_{k-1}$ is in error for such a pattern, the ISI compensation corresponding to the incorrect $D_{k-1}$ helps in restoring the signal for the $D_k$ symbol. For example, a simplified analysis is provided below:

Consider NRZ data transmission on a channel whose pulse response has a main cursor of $h_0$ and a first tap postcursor of $h_1$. The signal level, $X_k$, corresponding to the $D_k$ bit is provided in Equation 1.

$$X_k = h_0 \cdot \text{sgn}(D_k) + h_1 \cdot \text{sgn}(D_{k-1}) \quad \text{Equation 1}$$

The output signal level, $Y_k$, corresponding to the $D_k$ bit after ISI compensation with a correct detection of $D_{k-1}$ is given by Equation 2:

$$Y_k = h_0 \cdot \text{sgn}(D_k) + h_1 \cdot \text{sgn}(D_{k-1}) - \quad \text{Equation 2}$$
$$h1 \cdot \text{sgn}(D_{k-1}) => Y_k = h_0 \cdot \text{sgn}(D_k)$$

However, when there is an error in detection of $D_{k-1}$, the signal level, $Y_k$, corresponding to the $D_k$ bit after ISI compensation with an incorrect tentative decision is given by Equation 3:

$$Y_k = h_0 \cdot \text{sgn}(D_k) + h_1 \cdot \text{sgn}(D_{k-1}) - \quad \text{Equation 3}$$
$$h1 \cdot \text{sgn}(D_{k-1}) => Y_k = h_0 \cdot \text{sgn}(D_k) + 2h1 \cdot \text{sgn}(D_{k-1})$$

But when $D_{k-1}=D_k$, the signal level, $Y_k'$, after incorrect tentative decision of $D_{k-1}$ is actually positively restored for the correct detection of $D_k$ bit as given by Equation 4:

$$Y_k = h_0 \cdot \text{sgn}(D_k) + 2h_1 \cdot \text{sgn}(D_k) => Y_k = (h_0 + 2h_1) \cdot \text{sgn}(D_k) \quad \text{Equation 4}$$

It can therefore be seen that is a lower chance of error even when the previous decision is incorrect. By extending the above analysis, we can conclude that in the DFFE topology as shown in FIGS. 8 and 9, the BER of final stage slicers, $D_k^1$, is lower than the BER of initial stage slicers, $D_k^0$.

Figure 10:
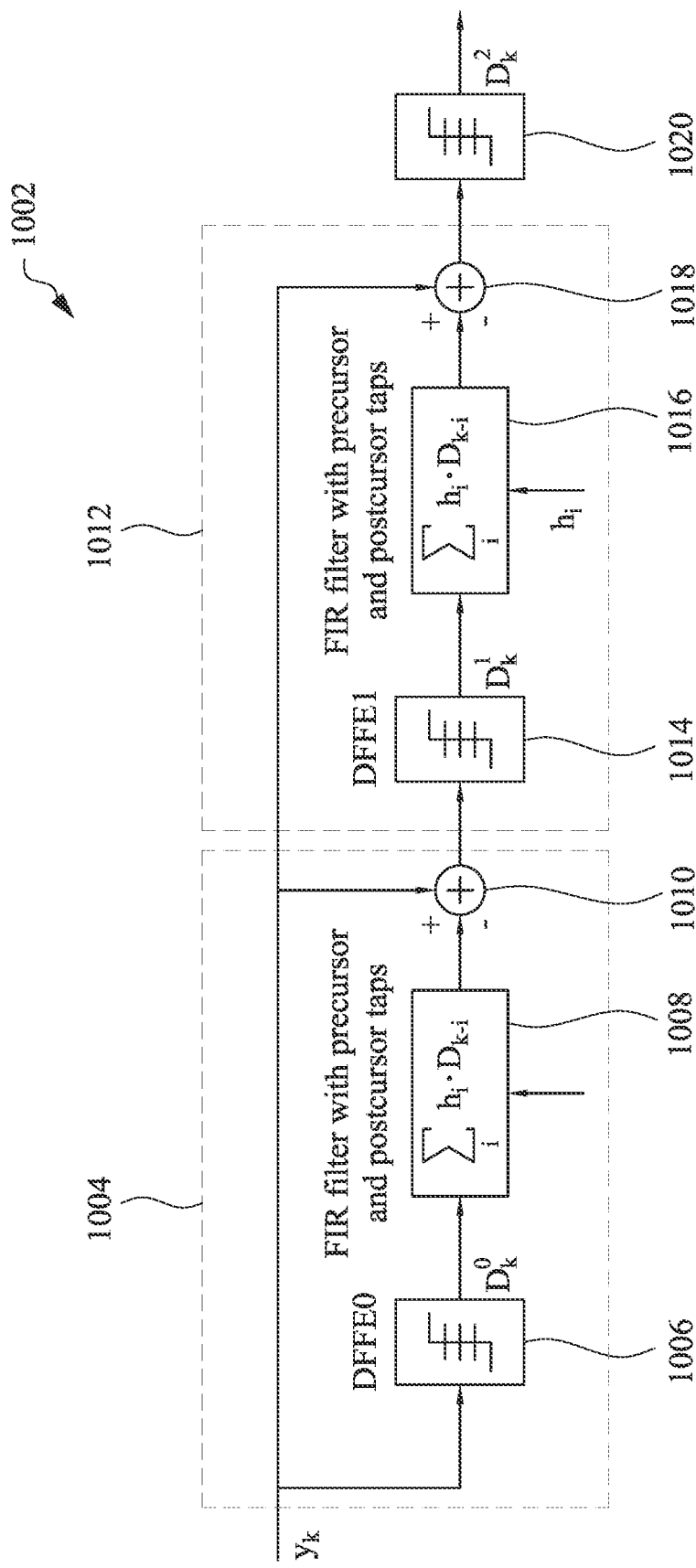
FIG. 10 depicts a conceptual block diagram of a two-stage DFFE in accordance with examples of the present disclosure.

The probability of error detection can be expressed as:

$$P_e(D_k^1) = P_e(D_k^0) \cdot P_e(D_k^1, D_k^0 | e=1) \quad \text{Equation 5}$$

where $P_e(D_k^1)$ stands for the probability of error in $D_k^1$ and $P_e(D_k^1, D_k^0 | =1)$ stands for the probability of error in $D_k^1$ when there is an error in $D_k^0$. From the above equation, we can see that $P_e(D_k^1) < P_e(D_k^0) => \text{BER}(D_k^1) < \text{BER}(D_k^0)$. This property of DFFE can be can be used to cascade multiple stages of DFFE and progressively lower the BER of each iteration until we reach the desired BER level or until we reach a stage where no further BER reduction is possible due to SNR being limited by noise and not ISI. A block diagram for a 2-stage DFFE 1002 is shown in FIG. 10. More specifically, a first stage 1004 may include a tentative decision slicer 1006 which provides tentative decision to a first FIR filter 1008. An equalized signal from the first junction 1010 may be provided to the second stage 1012, which includes a decision slicer 1014, which can be considered a tentative decision slicer. The quantized decisions from the decision slicer 1014 may be provided to a second FIR filter 1016. The equalized signal resulting from the second junction 1018 may be provided to the decision slicer 1020.

The BER relations of each stage can be expressed as follows:

$$\text{BER}(D_k^2) < \text{BER}(D_k^1) < \text{BER}(D_k^0) \quad \text{Equation 6}$$

The above equation be generalized and extended for multiple stages.

In accordance with examples of the present disclosure, the decision slicers, such as decision slicers 904 and/or 910, are inherently non-linear in nature but based on some simplifying assumptions, a linear model for the purposes of analysis can be built. One potential disadvantage of using decision slicers, such as decision slicers and/or 910, is that the decision slicers block the noise from passing through and thus the slicer can be considered to be an open circuit for noise analysis. It is evident that there is no noise enhancement due to the use of slicers in the FIR and thus for this analysis, the signal equalization case can be considered.

In a fully equalized case, the signal levels before and after the slicers are at their corresponding logic amplitude levels. Thus the slicer can be considered as a short for such cases. To be more accurate, one can use a scaling factor of a; but for the purposes of this analysis, $\alpha=1$.

Considering an ideal feedback equalizer with 'm' precursor and 'n' postcursor taps, the equation for such an equalizer is given by Equation 7:

$$y_k = x_k - \Sigma_{i=-m}^{i=n} h_i \cdot D_{k-i}, \; i \neq k \qquad \text{Equation 7}$$

This is similar to a DFE except that the above equation includes precursor tap correction as well, whereas DFE is limited to postcursor ISI correction only. It also has to be noted that there is no practical way to realize the above equalizer since it requires the use of future symbols. This analysis is simply to compare the performance of DFFE with such an ideal equalizer.

Figure 11:
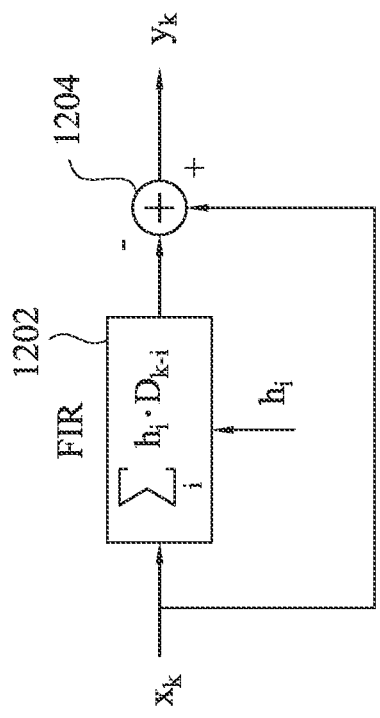
FIG. 11 depicts a linear model of an ideal feedback equalizer in accordance with examples of the present disclosure.

Thus, a linearized model for such an ideal feedback equalizer is shown in FIG. 11. The FIR 1102 in the feedback path of this ideal equalizer is similar to the FIR shown in FIGS. 5 and 7A and is given by Equation 8:

$$FIR = \Sigma_{i=-m}^{i=n} h_i \cdot z^{-i+m}, \; i \neq 0 \qquad \text{Equation 8}$$

The transfer function of this ideal equalizer, Ideal_Feedback_Eq(z), then follows from the linear model of FIG. 7A as shown below in Equation 9:

$$\text{Ideal\_Feedback\_}Eq(z) = 1/(1+FIR) \qquad \text{Equation 9}$$

Using Taylor series expansion, the above equation can be expressed as Equation 10:

$$\text{Ideal\_Feedback\_}Eq(z) = 1 - FIR + FIR^2 - FIR^3 + FIR^4 \qquad \text{Equation 10}$$

Figure 12:
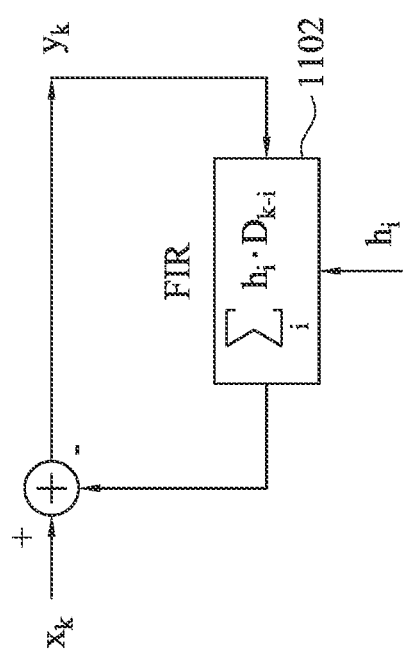
FIG. 12 depicts a linear model of a DFFE in accordance with examples of the present disclosure.
Figure 13:
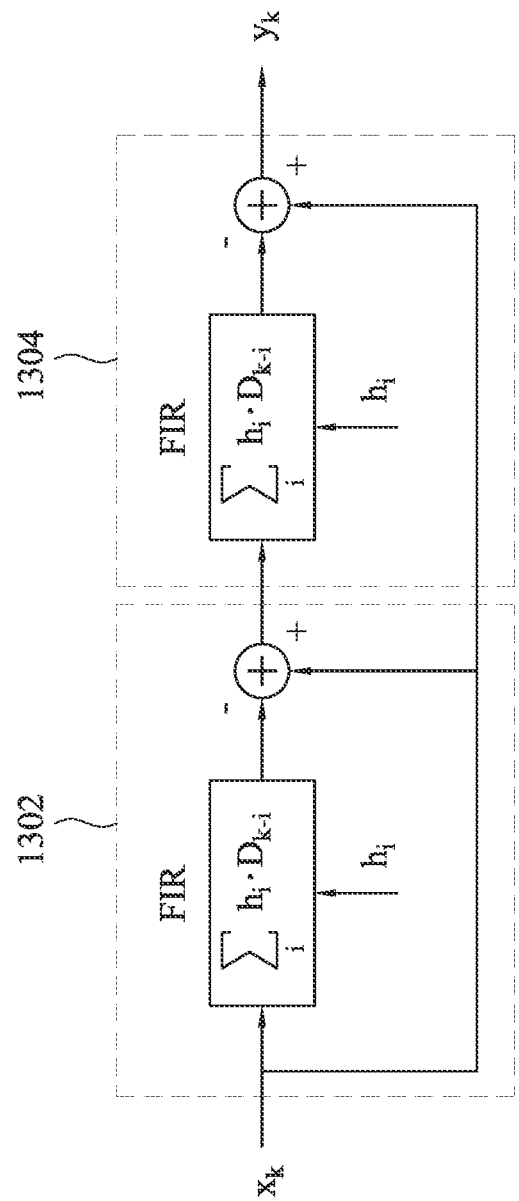
FIG. 13 depicts a linear model of a two-stage DFFE in accordance with examples of the present disclosure.

Now, considering the linearized model of DFFE (such as the DFFE 510 of FIG. 5) which is shown in FIG. 12, the transfer function of DFFE, DFFE(z), can be expressed as DFFE(z)=1−FIR. Accordingly, the DFFE transfer function lacks the higher order terms of the ideal equalizer. However, by cascading multiple DFFE stages, each higher order term can be realized with every additional iteration stage. For example, a linearized model of a 2-stage DFFE as shown in FIG. 13, includes a first stage 1302 and a second stage 1304. The transfer function of a 2-stage DFFE, DFFE2(z), is given by Equation 11:

$$DFFE2(z) = 1 - FIR \cdot (1 - FIR) => DFFE2(z) = 1 - FIR + FIR^2 \qquad \text{Equation 11}$$

Similarly, the transfer function of a 3-stage DFFE, DFFE3(z), is given by Equation 12:

$$DFFE3(z) = 1 - FIR \cdot (1 - FIR + FIR^2) => DFFE3(z) = 1 - FIR + FIR^2 - FIR^3 \qquad \text{Equation 12}$$

The analysis can be extended to show that the higher order terms of an ideal equalizer can be realized by adding corresponding stages of DFFE. For a practical application with a reasonable starting SNR, the DFFE can achieve within first few iterations the same performance as that of an ideal feedback equalizer even with precursor taps. But a benefit of DFFE is that while the ideal feedback equalizer is not implementable, DFFE is easy to implement even with the inclusion of precursor taps.

Figure 14:
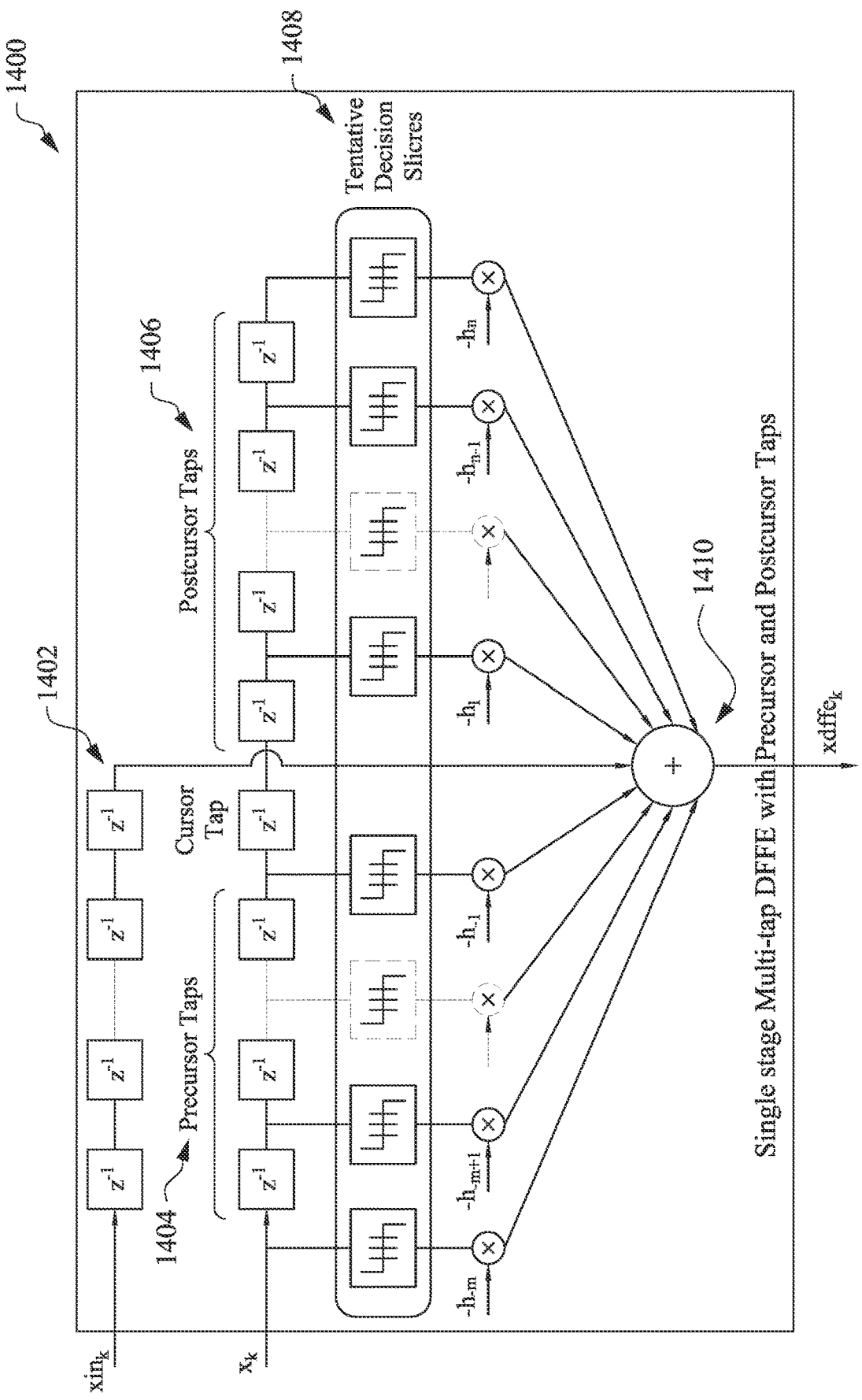
FIG. 14 depicts a signal stage DFFE for cascaded DFFE in accordance with examples of the present disclosure.
Figure 15:
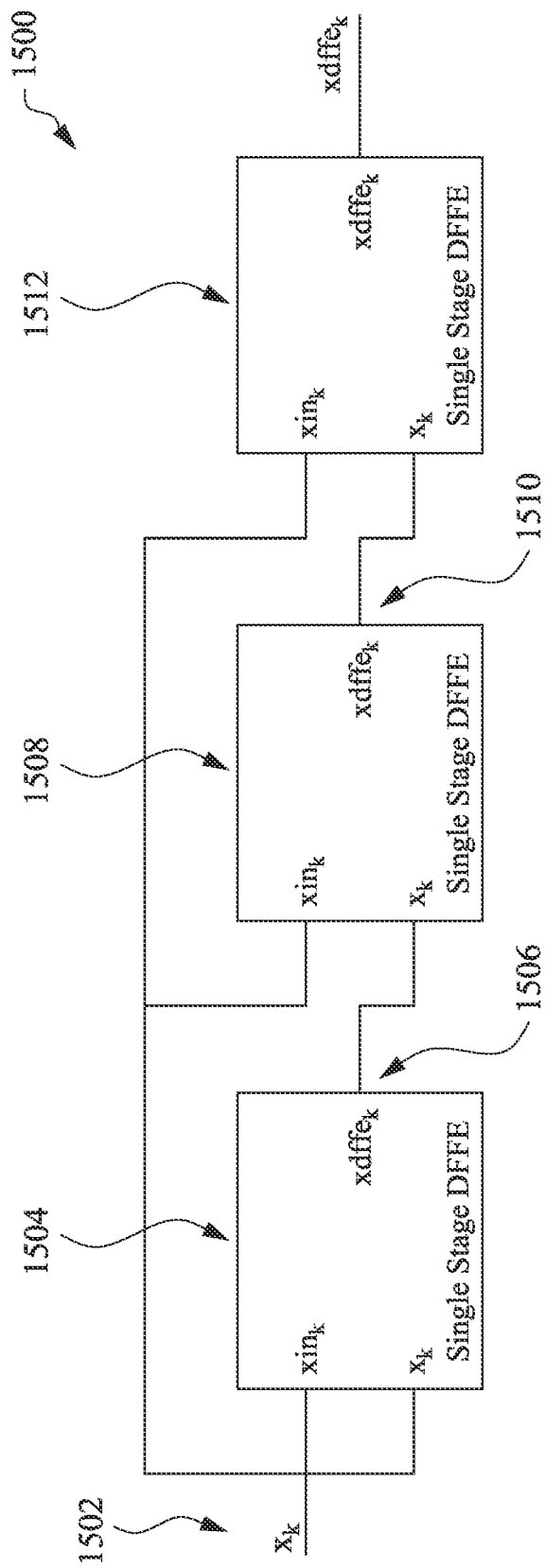
FIG. 15 depicts a three-stage DFFE with DFE outputs as initial tentative decisions in accordance with examples of the present disclosure.

DFFE, such as the DFFE 510 of FIG. 5, is an iterative equalizer which can be cascaded multiple times to realize a higher order DFFE. To build a higher order multi-tap DFFE, the multi-tap DFFE in a single stage DFFE, such as that depicted as DFFE 800 in FIG. 8, may be modified to provide the DFFE 1400 as illustrated in FIG. 14, by separating the cursor path 1402 from the precursor taps 1404 and postcursor taps 1406. Accordingly, the cursor from the cursor path 1402 is provided to each subsequent stage unaltered from the previous stage. For example, the cursor path 1502 may be provided to the first stage 1504, second stage 1508, and third stage 1512. Returning to FIG. 14, the precursor taps 1404 and postcursor taps 1406 may be provided to the tentative decision slicers 1408 of the instant DFFE, scaled and summed at the junction 1410 to be provided as an output. As depicted in FIG. 15, the output 1506 from the first stage 1504 is provided to the second stage 1508 and the output 1510 from the second stage 1508 is provided to the third stage 1512. Thus, by cascading three single stage DFFE modules as shown in FIG. 15, a third order DFFE may be realized.

Figure 16:
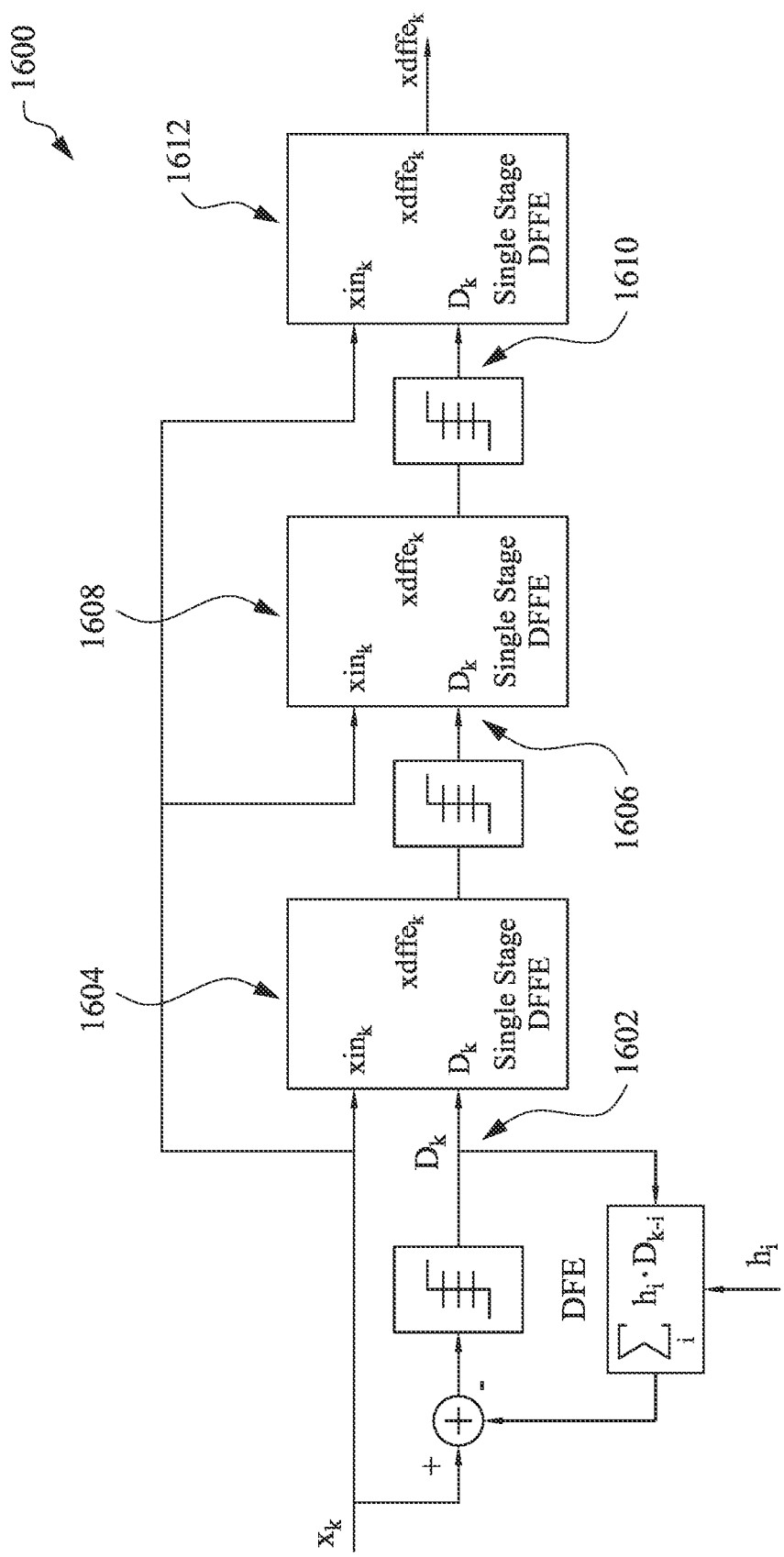
FIG. 16 depicts a three-stage DFFE in accordance with examples of the present disclosure.
Figure 17:
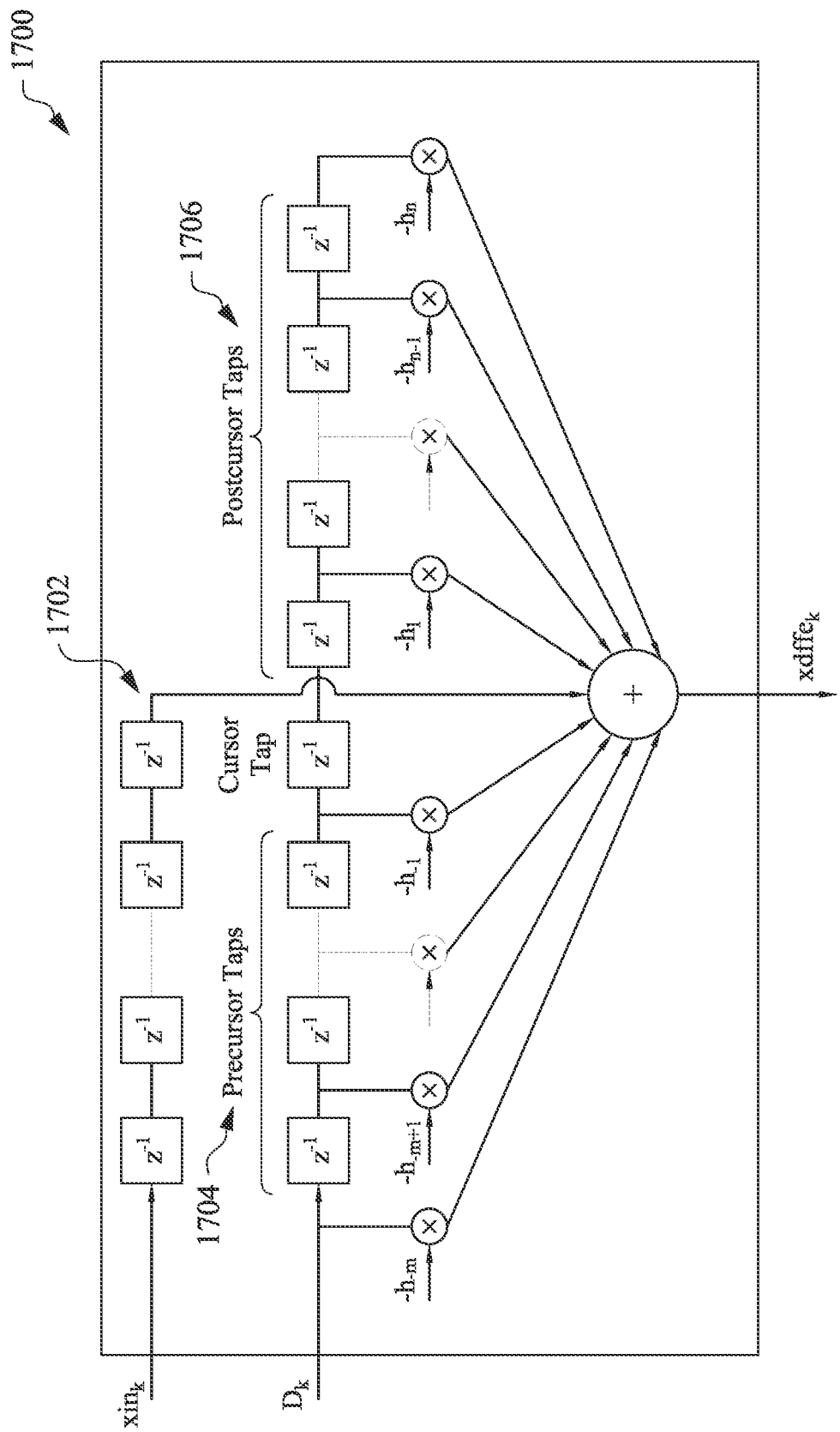
FIG. 17 depicts a single-stage DFFE for a cascaded DFFE in accordance with examples of the present disclosure.

The number of DFFE stages required may be a function of the BER of the initial decisions. The better the BER at the outset, the fewer the DFFE stages may be required. To improve the quality of the initial tentative decisions, DFE slicer outputs may be used instead of raw slicer outputs depicted in FIGS. 14 and 15. That is, a 3-stage DFFE 1600 as shown in FIG. 16 uses DFE outputs 1602 as initial tentative decisions in the first stage 1604. To accommodate the DFE slicer outputs 1602, the single stage DFFEs 1604, 1608, and 1612 have been modified to take decisions as inputs by utilizing slicers external to the DFFEs 1604, 1608, and 1612. The use of this cascaded DFFE configuration, such as the 3-stage DFFE 1600 as shown, not only eliminates residual ISI but also enables optimized pulse shaping for MM CDR that leads to robust performance with less sensitivity to SerDes tuning. Accordingly, a single stage of the DFFE 1600, such as the DFFE 1604, 1608, and/or 1612, is depicted as a DFFE 1700 in FIG. 17. The DFFE 1700 is similar to the DFFE 1400 of FIG. 14 but differs in that the decision slicers 1408 of the DFFE 1400 are not included within the DFFE 1700. That is, decision slicers, such as decision slicers 1606 and 1610, are external to the DFFEs 1604 and 1608 respectively, as depicted in FIG. 16. The DFFE 1700 still separates the cursor path 1702 from the precursor taps 1704 and postcursor taps 1706.

One of the biggest challenges of integrating MM CDR with equalization blocks in SerDes is to determine a joint adaptation solution that resolves undesired coupling mechanisms between CDR and equalization adaptation. The proposed SerDes receiver architecture 500 with its unique combination of CDR, equalization and joint adaptation not only resolves any unwanted coupling between CDR and equalization adaptation but the architecture also shapes the pulse response at the CDR node in such a way that it's optimal for MM CDR and overall SerDes margins.

The adaptation of equalization blocks such as FFE, DFE and DFFE is typically implemented using least mean squares (LMS) algorithm that minimizes the error power of the signal when compared to the target equalized signal levels. The goal of the adaptation of equalization tap coefficients is to eliminate any residual ISI at those tap positions. This discussion will focus on $h_{-1}$ and $h_1$, the first precursor tap ISI and first postcursor tap ISI respectively, since MM CDR is impacted primarily by them. The locking condition for MM CDR is given by $h_{-1}=h_1$. The MM CDR PED, listed here just for completeness, is implemented using signal level y(k) based PED equation of Equation 13:

$$(k-1)\cdot[k]-(k)\cdot[k-1] \quad \text{Equation 13}$$

or error e(k) based PED equation of Equation 14:

$$[k-1]\cdot[k]\cdot[k]\cdot[k-1] \quad \text{Equation 14}$$

To overcome coupling issues between CDR and equalization, various techniques have been used in the past such as introducing residual ISI at the CDR node; however, such techniques affect the cost of impacting overall margins and tuning complexity regarding how much residual ISI to introduce. The proposed SerDes receiver architecture 500 addresses these coupling issues by having CDR tapped from an intermediate node in the equalization data path and follow on equalization stages that compensate both precursor and postcursor ISI. For example, returning to FIG. 5, the CDR 526 is tapped between the FFE 502 and junction 504, while the equalization stages including DFFE 510, DFFE 512, and DFFE 514, compensate for both precursor and postcursor ISI. Coupled with the ability to add or subtract ISI at both the CDR 526 and final equalized nodes provides a pulse response at the CDR node 526 in a way that is optimal for MM CDR but without any residual ISI at the final equalized node.

Attributes of the proposed SerDes receiver architecture that ensure optimized CDR pulse shaping are summarized below. More specifically, the CDR is tapped from the FFE node 526 for example and followed by one or more DFFEs, such as DFFEs 510, 512, and 514) having the ability to compensate both precursor ISI ($h_{-1}$) and postcursor ISI ($h_1$) such that MM CDR PED is used with a convergence condition of $h_{-1}=h_1$. Moreover, adaptation is driven from the final equalized node; that is, LMS adaptation is used to drive both FFE and DFFE equalization. For example, as adaptation minimizes ISI at the FFE node utilizing the LMS coefficients 524 for example, the pulse response becomes more symmetric driving MM CDR to a better convergence point; because the DFFE adaptation runs in parallel—providing LMS coefficients to the DFFEs 510, 512, and 514 for example, the multistage DFFE eliminates residual ISI seen at the CDR node 526 which is symmetric in terms of $h_{-1}$ and $h_1$ by virtue of MM CDR adaptation; and the net result is a symmetric pulse response at the CDR node 526 that is near optimal for MM CDR but without the downside of residual ISI at the final equalized node.

For reliable convergence, the adaptation loop gain of CDR is typically set to be higher than that of FFE which is in turn set higher than that of DFFE. Additional details of the CDR pulse shaping mechanism as highlighted above is further explained below.

Equalization is shared between FFE and DFFE with adaptation driving both their LMS coefficients for example, in such a way that final ISI at the DFFE node is zero. That is, $=>h_{-1}(DFFE)=0$, $h_1(DFFE)=0 \rightarrow$ driven by LMS adaptation.

This ensures that there is residual ISI at the FFE node which also happens to be the CDR node. The amount of the residual ISI at FFE node 502 depends on the adapted FFE coefficients 524 and DFFE coefficients 520 which in turn are determined by the relative loop gains of FFE and DFFE adaptation. With non-zero DFFE coefficients and final ISI at zero, there may be residual ISI at the FFE node 502 that DFFE compensated for. That is, $=>h_{-1}(FFE)=h_1(FFE)\neq 0 \rightarrow$ due to DFFE sharing adaption.

Since MM CDR is adapting in parallel, a lock condition occurs where $h_{-1}=h_1$ at the CDR node 526. That is, $=>h_{-1}(FFE)=h_1(FFE)\rightarrow$ driven by MM CDR Accordingly, there is a symmetric pulse response with non-zero ISI at the FFE node 502 or CDR node 526 which is ensured by the joint adaptation of MM CDR, FFE and DFFE. That is, $=>h_{-1}(FFE)=h_1(FFE)\neq 0\rightarrow$ driven by joint adaptation of MM CDR, FFE and DFFE.

This is an optimal condition for MM CDR. Even if the pulse response before adaptation is asymmetric, the system converges with ISI being injected or removed at both the FFE node 502 (which is the CDR node 526) and the DFFE node (which is the final equalized node) in such a way that there is a symmetric pulse response with non-zero ISI at the CDR node 526. In some cases, ISI is injected at the FFE node 502 to make the pulse response symmetric and to have the overall ISI to be zero.

The symmetric CDR pulse shaping can be leveraged to simplify adaptation and speed up overall system convergence by forcing $h_{-1}$ and $h_1$ DFFE coefficients to be equal and adapting or fixing only one of them.

The advantage with this CDR pulse shaping procedure over previous CDR adjustment mechanisms using residual ISI is that the residual ISI at the CDR node 526 is fully compensated by the follow on DFFE stages 510, 512, and 514 with little to no impact to overall BER. Furthermore, the residual ISI is introduced in a symmetric manner with $h_{-1}=h_1$, which is optimal for MM CDR. Since the pulse response is largely symmetric regardless of the amount of residual ISI at the CDR node 526, CDR locks near the peak of the pulse response and is less sensitive to converged values which are determined by the relative adaptation loop gains.

Another benefit of having a symmetric pulse response at the CDR node 526 exists. The CDR locking point is determined by the pulse response at the CDR node 526 and as such even if the CDR node locks to an optimal point relative to the eye at the CDR node 526, it is not necessarily optimal relative to the eye at the fully equalized node, for example the output of DFFE 514, thereby possibly reducing timing margins at the fully equalized node, for example the output of DFFE 514, even if the ISI is fully compensated. However, with a symmetric pulse response at the partially equalized CDR node 526, the optimal CDR locking point as determined by the partially equalized eye tends to be fairly close to the optimal locking point relative to the fully equalized eye. This is because when the partially equalized eye is superposed over a fully equalized eye, the zero crossing points are similar. This can be concluded with a simplified analysis as shown below.

For a fully equalized eye, the zero crossing point is at half UI point before or after the peak of the eye. For the partially equalized signal with a symmetric pulse response, the pulse response value at half UI point before the peak for 0->1 transition can be approximated as shown in Equation 15:

$$p_{0.5}=h_{-0.5}-h_{0.5} \text{(for 0}\rightarrow\text{1 transition)} \quad \text{Equation 15}$$

where $p_{0.5}$ is the signal value at half UI point before the peak of the pulse, $h_{-0.5}$ is the half UI precursor ISI value and $h_{0.5}$ is the half UI postcursor ISI value respectively. For a symmetric pulse response, we can consider $h_{-0.5}$ to be equal to $h_{0.5}$. Therefore, as provided by Equation 16, $$p_{0.5}=h_{-0.5}-h_{0.5}=0 \text{ (for 0}\rightarrow\text{1 transition).} \quad \text{Equation 16}$$

Similarly, $p_{0.5}=-h_{-0.5}+h_{0.5}=0$ (for 1$\rightarrow$0 transition).

Based on the above equations, the zero crossing points for the partially equalized eye and the fully equalized eye are at the same location when superposed over each other. Therefore, the optimal CDR locking points relative to both the eyes are similar. This analysis is based on simplified assumptions assuming there is no ISI impact beyond the first precursor and postcursor taps. However, since they are dominant ISI terms and CDR being primarily impacted only by them, the conclusions are still valid.

While least mean square (LMS) based adaptation is disclosed herein, and while some embodiments may refer to least mean square (LMS) coefficients, coefficients derived by other means within the scope of the disclosure.

Figure 18:
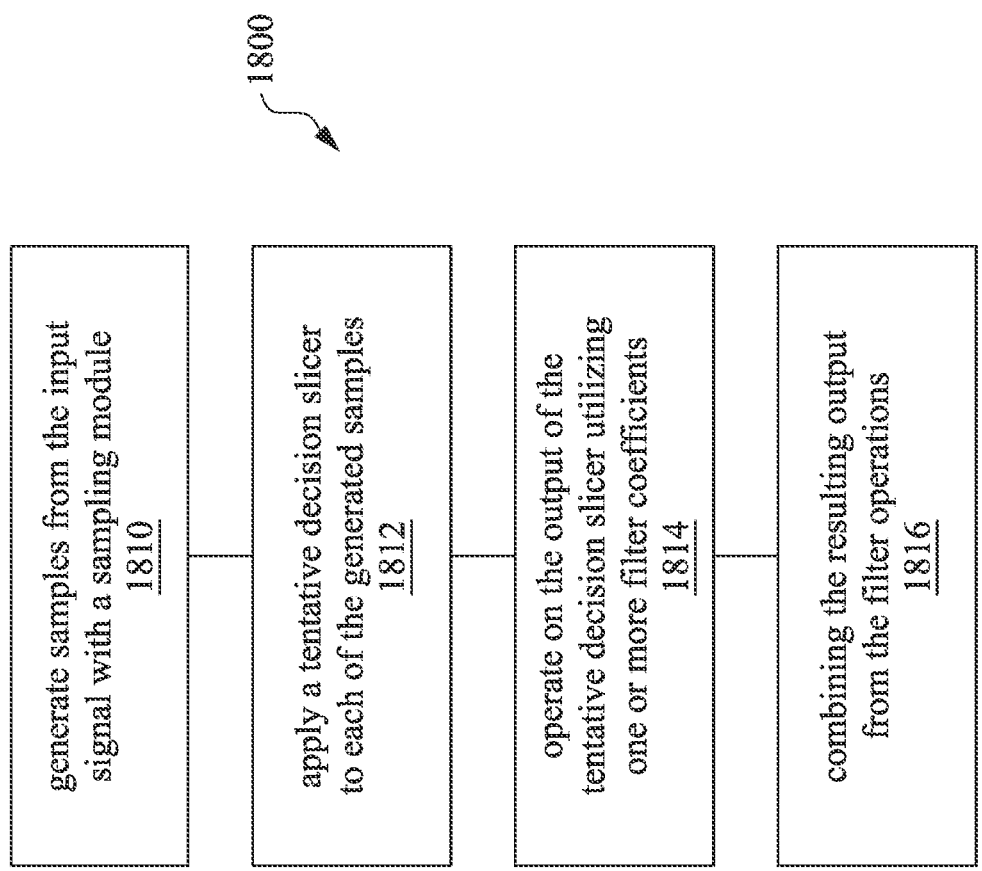
FIG. 18 is a flow diagram illustrating a method in accordance with some embodiments.

FIG. 18 is a flow diagram illustrating a method 1800 in accordance with some embodiments. The method could be implemented with the SerDes receiver architecture 500 shown in FIG. 5, though the illustrated method is applicable to other architectures. Referring to FIG. 5 together with FIG. 18, at a step 1810 an output of a feedforward equalizer 502 and a decision feedback equalizer 508 is received at a decision feedforward equalizer 510. The feedforward equalizer 502 equalizes an input signal based on a plurality of coefficients. At step 1812, the feedforward equalizer 502 is provided the plurality of coefficients based on an output of the decision feedforward equalizer 510.

In one example, a clock data recovery system is provided. The clock data recovery system may include a feedforward equalizer configured to equalize a first input signal received from an analog to digital controller based on a plurality of received tap coefficients, thereby generating a first output signal and an adder configured to add the first output signal and a feedback signal originating from a decision feedback equalizer, thereby generating a second output signal. The clock data recovery system may further include a slicer configured to receive the second output signal and provide an initial set of tentative decisions to a decision feedforward equalizer, the decision feedforward equalizer providing an equalized output signal, and a second adder configured to generate a first error signal based on the equalized output signal from the decision feedforward equalizer, wherein the plurality of received tap coefficients are based on the error signal. Moreover, the clock data recovery system may include a clock data recovery circuit configured to receive the first output signal and provide an adjustment signal to the analog to digital controller.

In another example, a serializer/deserializer (SerDes) receiver is provided. The SerDes receiver may include a feedforward equalizer, a decision feedback equalizer, and a decision feedforward equalizer coupled to the feed forward equalizer and the decision feedback equalizer, wherein an output of the decision feedback equalizer is provided to the decision feedforward equalizer and an output of the feedforward equalizer is provided to the decision feedforward equalizer and a clock data recovery unit.

In another example, a method is provided. The method may include receiving, at a decision feedforward equalizer, an output of a feedforward equalizer and a decision feedback equalizer, the feedforward equalizer equalizing an input signal based on a plurality of coefficients, and providing the feedforward equalizer the plurality of coefficients based on an output of the decision feedforward equalizer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock data recovery method comprising:
receiving a first input signal from an analog to digital controller;
equalizing the first input signal based on a plurality of received tap coefficients to generate a first output signal;
adding the first output signal and a feedback signal originating from a decision feedback equalizer to generate a second output signal;
providing an initial set of tentative decisions to a decision feedforward equalizer;
providing an equalized output signal by the decision feedforward equalizer;
generating an error signal based on the equalized output signal from the decision feedforward equalizer, wherein the plurality of received tap coefficients are based on the error signal; and
providing an adjustment signal to the analog to digital controller based on the first output signal.

2. The method of claim 1, further comprising an analog front end connected to a channel, the analog front end configured to receive an input signal from the channel, wherein the analog front end includes at least one of a continuous time linear equalizer and/or a variable gain amplifier.

3. The method of claim 1, wherein the decision feedforward equalizer receives the first output signal.

4. The method of claim 3, wherein the decision feedforward equalizer is a first decision feedforward equalizer of a plurality of decision feedforward equalizers, and wherein a second feedforward equalizer of the plurality of feedforward equalizers receives input from the first decision feedforward equalizer of the plurality of feedforward equalizers.

5. The method of claim 1, wherein the plurality of received tap coefficients are based on an adaptation engine providing least mean squares coefficients.

6. The method of claim 5, wherein the adaptation engine provides least mean squares coefficients to the decision feedback equalizer.

7. The method of claim 6, wherein the adaptation engine provides least mean squares coefficients to the decision feedforward equalizer.

8. The method of claim 1, wherein the decision feedforward equalizer includes a plurality of precursor taps, a cursor tap, and a plurality of postcursor taps, the plurality of precursor taps and the plurality of postcursor taps providing a sample of the first output signal sampled at various times to a plurality of tentative decision slicers.

9. The method of claim 8, wherein an output of each of the tentative decision slicers is scaled and combined with the output from the cursor tap.

10. A serializer/deserializer (SerDes) receiver, comprising:
a feedforward equalizer;
a decision feedforward equalizer coupled to receive an output of the feedforward equalizer; and
a clock data recovery unit coupled to receive an output of the feedforward equalizer.

11. The SerDes receiver of claim 10, further comprising a decision feedback equalizer providing an output to the decision feedforward equalizer.

12. The SerDes receiver of claim 10, further comprising a decision feedback equalizer coupled to receive the output of the feedforward equalizer.

13. The SerDes receiver of claim 10, further comprising an equalization module coupled to receive an output of the decision feedforward equalizer.

14. The SerDes receiver of claim 13, wherein the equalization module and the clock data recovery unit are decoupled from one another.

15. The SerDes receiver of claim 10, wherein the decision feedforward equalizer includes a plurality of postcursor taps, a cursor tap, and a plurality of precursor taps coupled to the output of the feedforward equalizer.

16. The SerDes receiver of claim 15, further comprising a cascading decision feedforward equalizer including the decision feedforward equalizer and a second decision feedforward equalizer, wherein an output from the decision feedforward equalizer is provided to the second decision feedforward equalizer.

17. The SerDes receiver of claim 15, wherein the clock data recovery unit provides an adjustment signal to an analog to digital controller coupled to the feedforward equalizer.

18. The SerDes receiver of claim 10, further comprising:

a channel;

an analog front end; and an analog to digital controller coupled to the feedforward equalizer, wherein the analog front end is between the channel and the analog to digital controller.

19. A method comprising:

receiving, at a decision feedforward equalizer, an output of a feedforward equalizer, the feedforward equalizer equalizing an input signal based on a plurality of coefficients; and providing the feedforward equalizer the plurality of coefficients based on an output of the decision feedforward equalizer.

20. The method of claim 19, further comprising receiving, at the decision feedforward equalizer, an output of a decision feedback equalizer.

* * * * *